(12) United States Patent
Nishiura et al.

(10) Patent No.: US 7,388,229 B2
(45) Date of Patent: Jun. 17, 2008

(54) THIN FILM TRANSISTOR SUBSTRATE, MANUFACTURING METHOD OF THIN FILM TRANSISTOR, AND DISPLAY DEVICE

(75) Inventors: Atsunori Nishiura, Tokyo (JP); Takuji Imamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/782,213

(22) Filed: Jul. 24, 2007

(65) Prior Publication Data
US 2008/0035930 A1  Feb. 14, 2008

(30) Foreign Application Priority Data
Aug. 8, 2006  (JP)  ............... 2006-215693

(51) Int. Cl.
*H01L 27/14* (2006.01)
(52) U.S. Cl. ............... 257/72; 257/59; 257/258; 257/288; 257/E29.117
(58) Field of Classification Search ............ 257/59, 257/72, 258, 288, E51.005, E29.117
See application file for complete search history.

(56) References Cited

U.S. PATENT DOCUMENTS 5,999,235 A  12/1999  Takeguchi et al.

2001/0011726 A1  8/2001  Hayashi et al.
2003/0214006 A1  11/2003  Nakamura et al.

FOREIGN PATENT DOCUMENTS

| JP | 10-178177 | 6/1998 |
|----|-----------|--------|
| JP | 2001-217423 | 8/2001 |
| JP | 2002-26330 | 1/2002 |
| JP | 2003-330388 | 11/2003 |

*Primary Examiner*—Evan Pert
*Assistant Examiner*—Tan N Tran
(74) *Attorney, Agent, or Firm*—Oblon, Spivak, McClelland, Maier & Neustadt, P.C.

(57) ABSTRACT

A thin film transistor substrate includes a first conductive layer formed on a substrate, an anti-diffusion layer deposited on the first conductive layer, a semiconductor layer formed on the anti-diffusion layer, a gate insulating layer deposited on the semiconductor layer, a second conductive layer formed on the gate insulating layer, an interlayer insulating layer deposited on the second conductive layer, and a third conductive layer formed on the interlayer insulating layer, in a first contact hole penetrating through the interlayer insulating layer and the gate insulating layer to reach the semiconductor layer, and in a second contact hole penetrating through the interlayer insulating layer, the gate insulating layer and the anti-diffusion layer to reach the first conductive layer. The third conductive layer includes a pixel electrode formed in island shape on the interlayer insulating layer.

9 Claims, 2 Drawing Sheets

THIN FILM TRANSISTOR SUBSTRATE, MANUFACTURING METHOD OF THIN FILM TRANSISTOR, AND DISPLAY DEVICE

BACKGROUND OF THE INVENTION

1. Field of the Invention

The present invention relates to a thin film transistor substrate, a manufacturing method of a thin film transistor, and a display device using the same.

2. Description of Related Art

An active matrix liquid crystal display device which uses a thin film transistor (TFT) substrate is widely used, as described in Japanese Unexamined Patent Application Publication Nos. 2001-217423 (Hayashi), 2002-26330 (Nakamura), and H10-178177 (Takeguchi). A TFT substrate of a related art is described hereinafter with reference to FIG. 3. FIG. 3 is a sectional view showing the sectional structure of a top-gate TFT substrate according to a related art. In the TFT substrate 101 in FIG. 3, a SiN (Silicon Nitride) film 12, which serves as an anti-diffusion layer, is deposited on a glass substrate 11. On the SiN film 12, a semiconductor layer 13, which includes a channel region 131, a source region 132 and a drain region 133, and a lower capacitor electrode 13a, which is made of the same material as the semiconductor layer 13, are formed in island shapes. The lower capacitor electrode 13a serves as an auxiliary capacitor region of a TFT 22.

Further, a $SiO_2$ (Silicon Dioxide) film 14, which serves as a gate insulating layer, is deposited to cover the semiconductor layer 13 and the lower capacitor electrode 13a. An island-shaped gate electrode 15 is then formed above the channel region 131 with the $SiO_2$ film 14 placed therebetween. Specifically, the $SiO_2$ film 14 is placed between the gate electrode 15 and the channel region 131, so that the gate electrode 15 is placed opposite to the channel region 131 of the semiconductor layer 13 with the $SiO_2$ film 14 interposed therebetween. The channel region 131 of the semiconductor layer 13 and the gate electrode 15 are thus placed opposite to each other with the $SiO_2$ film 14 interposed therebetween. Further, an island-shaped upper capacitor electrode 15a is formed above the lower capacitor electrode 13a with the $SiO_2$ film 14 placed therebetween. The upper capacitor electrode 15a is made of the same material as the gate electrode 15.

Then, a $SiO_2$ film 16, which serves as an interlayer insulating layer, is deposited on the gate electrode 15. The source region 132, the drain region 133, and the lower capacitor electrode 13a are respectively connected with a line electrode 17 through contact holes 20 which are formed in the $SiO_2$ film 14 and the $SiO_2$ film 16. The line electrode 17 is connected with the source region 132 to supply a display voltage to the TFT 22. The line electrode 17 is also connected with the drain region 133 to form a given circuit, such as supplying a display voltage to a pixel electrode.

Further, an upper insulating layer 18 is deposited on the line electrode 17. The line electrode 17 is connected with a pixel electrode 19 through a contact hole 21 which is formed in the upper insulating layer 18. The line electrode 17 is electrically connected with the source region 132 and the drain region 133 to transmit a picture signal or a control signal from the outside or the inside of a circuit on the substrate. As described above, in the top-gate TFT substrate of a related art, the line electrode 17 for connecting a plurality of elements such as a TFT and a capacitor is placed in an upper layer of the TFT substrate 101.

However, the present inventor has recognized the followings. In order to establish a connection of the line electrode 17 with the source region 132, the drain region 133 and with the lower capacitor electrode 13a to supply a display voltage to the pixel electrode 19, it is necessary to form the contact holes 20 and 21. The manufacturing process thus requires two steps of contact hole formation. Specifically, the process needs to form the contact holes 20 between the line electrode 17 and the source region 132, between the line electrode 17 and the drain region 133, and between the line electrode 17 and the lower capacitor electrode 13a, and further form the contact hole 21 between the line electrode 17 and the pixel electrode 19. Therefore, the number of masks and manufacturing steps which is required for forming contact holes is two, which is an disadvantage in manufacturing cost reduction.

In view of the foregoing, it is an object of the present invention to provide a thin film transistor substrate, a manufacturing method of a thin film transistor, and a display device which require a smaller number of masks and manufacturing steps by integrating contact hole formation steps.

SUMMARY OF THE INVENTION

According to a first aspect of the present invention, there is provided a thin film transistor substrate that includes a substrate; a first conductive layer formed above the substrate, the first conductive layer including a line electrode; an anti-diffusion layer deposited to cover the first conductive layer; a semiconductor layer formed in island shape above the anti-diffusion layer, the semiconductor layer including a channel region, a source region and a drain region; a gate insulating layer deposited to cover the semiconductor layer; a second conductive layer including a gate electrode formed above the channel region with the gate insulating layer interposed therebetween; an interlayer insulating layer deposited to cover the second conductive layer; and a third conductive layer formed above the interlayer insulating layer, in a first contact hole penetrating through the interlayer insulating layer and the gate insulating layer to reach the semiconductor layer, and in a second contact hole penetrating through the interlayer insulating layer, the gate insulating layer, and the anti-diffusion layer to reach the first conductive layer, the third conductive layer including a pixel electrode formed in island shape above the interlayer insulating layer.

According to a second aspect of the present invention, there is provided a manufacturing method of a thin film transistor that includes forming a first conductive layer including a line electrode above a substrate, depositing an anti-diffusion layer to cover the first conductive layer, forming an island-shaped semiconductor layer including a channel region, a source region and a drain region above the anti-diffusion layer, depositing a gate insulating layer to cover the semiconductor layer, forming an island-shaped second conductive layer including a gate electrode formed above the channel region with the gate insulating layer interposed therebetween, depositing an interlayer insulating layer to cover the second conductive layer, forming a first contact hole penetrating through the interlayer insulating layer and the gate insulating layer to reach the semiconductor layer, and a second contact hole penetrating through the interlayer insulating layer, the gate insulating layer and the anti-diffusion layer to reach the first conductive layer, and forming a third conductive layer including a pixel electrode above the interlayer insulating layer after forming the first contact hole and the second contact hole.

As described above, the present invention provides a thin film transistor substrate, a manufacturing method of a thin film transistor, and a display device which require a smaller number of masks and manufacturing steps by integrating the contact hole formation process.

The above and other objects, features and advantages of the present invention will become more fully understood from the detailed description given hereinbelow and the accompanying drawings which are given by way of illustration only, and thus are not to be considered as limiting the present invention.

DETAILED DESCRIPTION OF THE PREFERRED EMBODIMENTS

A preferred embodiment of the present invention is described hereinafter. The following description and the drawings are omitted or simplified as appropriate in order to clarify the description. Further, redundant description is omitted as appropriate in order to clarify the description.

First Embodiment

Figure 1:
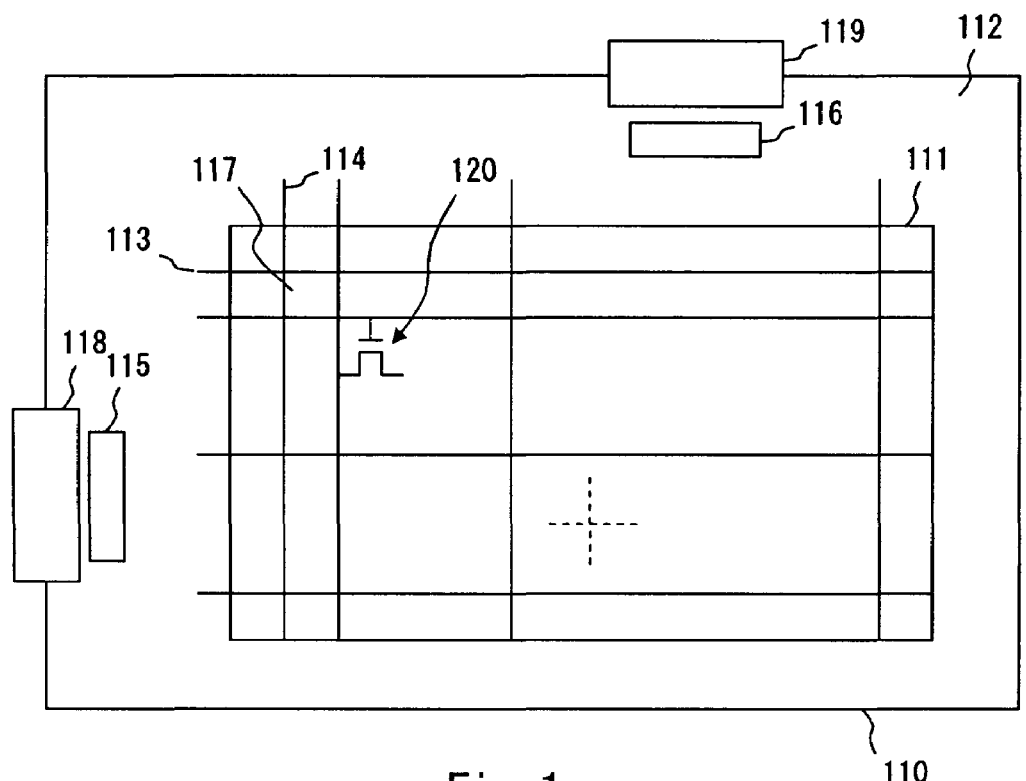
FIG. 1 is a top plan view showing a display device.

Referring first to FIG. 1, a display device which uses a TFT substrate according to an embodiment of the present invention is described hereinafter. FIG. 1 is a top plan view showing the structure of a TFT substrate which is used in a display device. Although the display device of this embodiment is described as a liquid crystal display device as an example, it is by way of illustration only, and a flat panel display device such as an organic EL display device may be used instead.

The display device of this embodiment includes a TFT substrate 110. The TFT substrate 110 is a substrate in which TFTs are arranged in an array, and it is also called a TFT array substrate. The TFT substrate 110 has a display area 111 and a frame area 112 which surrounds the display area 111. In the display area 111, a plurality of gate lines (scanning signal lines) 113 and a plurality of source lines (display signal lines) 114 are formed. The plurality of gate lines 113 are arranged in parallel with each other. The plurality of source lines 114 are also arranged in parallel with each other. The gate lines 113 and the source lines 114 are arranged to cross each other. The gate lines 113 and the source lines 114 are orthogonal to each other. The area which is surrounded by the adjacent gate lines 113 and source lines 114 is a pixel 117. Thus, the pixels 117 are arranged in matrix on the TFT substrate 110.

In the frame area 112 of the TFT substrate 110, a scanning signal driver 115 and a display signal driver 116 are placed. The gate line 113 extends from the display area 111 to the frame area 112. The gate line 113 is connected with the scanning signal driver 115 at the end of the TFT substrate 110. The source line 114 also extends from the display area 111 to the frame area 112. The source line 114 is connected with the display signal driver 116 at the end of the TFT substrate 110. An external line 118 is connected in close proximity to the scanning signal driver 115. An external line 119 is connected in close proximity to the display signal driver 116. The external lines 118 and 119 are wiring substrates such as FPC (Flexible Printed Circuit).

External signals are supplied to the scanning signal driver 115 and the display signal driver 116 through the external lines 118 and 119. The scanning signal driver 115 supplies a gate signal (scanning signal) to the gate line 113 according to an external control signal. The gate lines 113 are sequentially selected by the gate signal. The display signal driver 116 supplies a display signal to the source line 114 according to an external control signal and display data. A display voltage corresponding to display data is thereby supplied to each pixel 117.

Each pixel 117 has at least one TFT 120. The TFT 120 is placed in close proximity to the intersection of the source line 114 and the gate line 113. The TFT 120 supplies a display voltage to a pixel electrode, for example. Specifically, the TFT 120, which is a switching element, turns on by a gate signal from the gate line 113. A display voltage is thereby supplied from the source line 114 to a pixel electrode which is connected with a drain electrode of the TFT 120. Then, an electric field corresponding to the display voltage is generated between the pixel electrode and a counter electrode. Although not shown, an alignment film is formed on the surface of the TFT substrate 110.

In a liquid crystal display device, a counter substrate is placed opposite to the TFT substrate 110. The counter substrate is a color filter substrate, for example, and it is placed on the viewing side. On the counter substrate, a color filter, a black matrix (BM), a counter electrode, an alignment film and so on are formed. The counter electrode may be placed on the TFT substrate 110 in some cases. A liquid crystal layer is placed between the TFT substrate 110 and the counter substrate. Liquid crystals are thus interposed between the TFT substrate 110 and the counter substrate. Further, polarizing plates, wave plates and so on are placed on the outer sides of the TFT substrate 110 and the counter substrate. A backlight unit or the like is placed on the non-viewing side of a liquid crystal display panel.

Liquid crystals are driven by the electric field between the pixel electrode and a counter electrode. The orientation of the liquid crystals between the substrates is thereby changed. Accordingly, the polarization state of light which passes through the liquid crystal layer is changed. The polarization of the light which is linearly polarized by the polarizing plate is thereby further changed by the liquid crystal layer. Specifically, the light from the backlight unit becomes linearly polarized light by the polarizing plate on the TFT array substrate side. The polarization state of the linearly polarized light is changed by passing through the liquid crystal layer.

Therefore, the amount of light which passes through the polarizing plate on the counter substrate side varies according to the polarization state. Specifically, the amount of light which passes through the polarizing plate on the viewing side, out of the light from the backlight unit which passes through the liquid crystal display panel, is changed. The orientation of the liquid crystals varies according to an applied display voltage. It is therefore possible to change the amount of light which passes through the polarizing plate on the viewing side by controlling a display voltage. It is possible to display a desired image by changing a display voltage for each pixel.

In this embodiment, the case of manufacturing a top-gate TFT substrate which is used in a display device such as an above-described liquid crystal display device is described by way of illustration. However, a display device using a TFT substrate is not limited to a liquid crystal display device, and it may be an organic EL display or the like.

Figure 2:
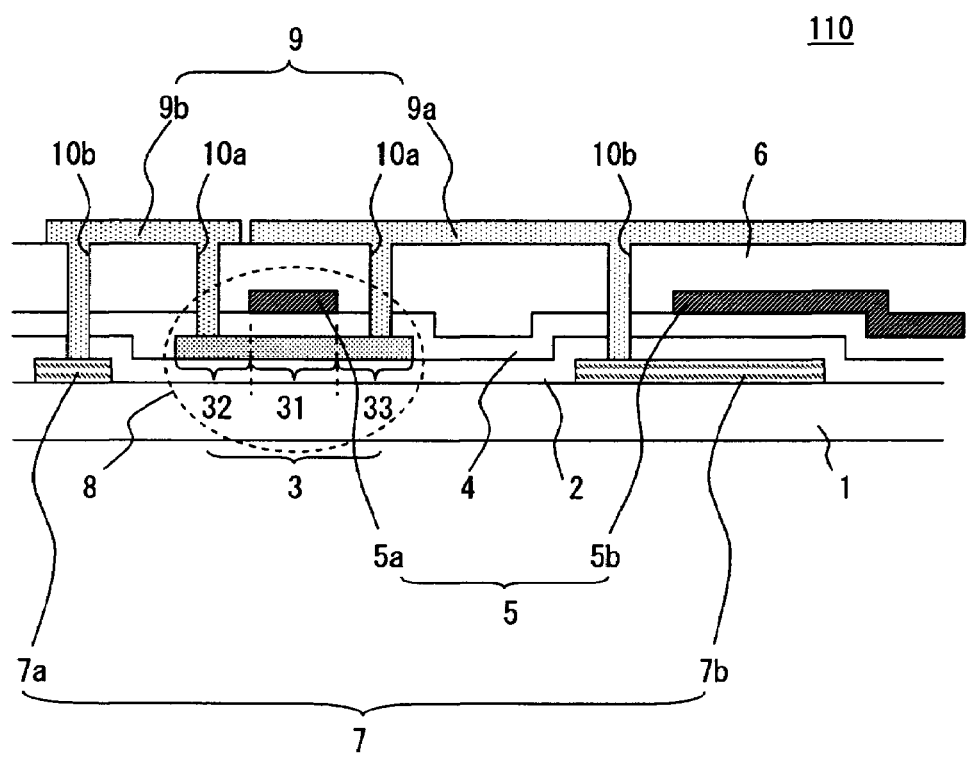
FIG. 2 is a sectional view showing a TFT substrate according to an embodiment of the present invention.

An example of a top-gate TFT substrate according to this embodiment is described hereinafter with reference to FIG. 2. FIG. 2 is a sectional view showing the sectional structure of the top-gate TFT substrate according to this embodiment. The TFT substrate 110 in FIG. 2 includes a glass substrate 1, a SiN film 2, a semiconductor layer 3, a SiO₂ film 4, a gate electrode 5a, an upper capacitor electrode 5b, a SiO₂ film 6, a line electrode 7a, a lower capacitor electrode 7b, a pixel electrode 9a, a connection pattern 9b, and contact holes 10a and 10b. The TFT substrate 110 is the same as the TFT substrate 110 shown in FIG. 1. The semiconductor layer 3 is composed of a channel region 31, a source region 32, and a drain region 33. The semiconductor layer 3, the SiO₂ film 4, and the gate electrode 5a form a TFT 8.

In the TFT substrate 110, the line electrode 7a and the lower capacitor electrode 7b are formed in island shapes on the glass substrate 1. The line electrode 7a and the lower capacitor electrode 7b are made of the same material as a first conductive layer 7. The lower capacitor electrode 7b serves as an auxiliary capacitor region of the TFT 8. Then, the SiN film 2 is deposited to cover the line electrode 7a and the lower capacitor electrode 7b. The SiN film 2 is an anti-diffusion layer to prevent diffusion of impurities into the semiconductor layer 3. After that, the semiconductor layer 3 is formed in island shape on the SiN film 2. The semiconductor layer 3 includes the channel region 31, the source region 32 and the drain region 33. The semiconductor layer 3 is placed in the area different from area above the first conductive layer 7 which includes the line electrode 7a and the lower capacitor electrode 7b.

Further, the SiO₂ film 4, which serves as a gate insulating layer, is deposited to cover the semiconductor layer 3. The gate electrode 5a is formed in island shape above the channel region 31 with the SiO₂ film 4 interposed therebetween. Specifically, the SiO₂ film 4 is placed between the gate electrode 5a and the channel region 31, so that the gate electrode 5a is placed opposite to the channel region 31 of the semiconductor layer 3 with the SiO₂ film 4 interposed therebetween. The channel region 31 of the semiconductor layer 3 and the gate electrode 5a are thus placed opposite to each other with the SiO₂ film 4 interposed therebetween. Further, the upper capacitor electrode 5b is formed in island shape above the lower capacitor electrode 7a with the SiN film 2 and the SiO₂ film 4 placed therebetween. The upper capacitor electrode 5b and the gate electrode 5a are made of the same material as a second conductive layer 5. The gate electrode 5a is connected with the gate line 113 which is shown in FIG. 1.

Furthermore, a SiO₂ film 6, which serves as an interlayer insulating layer, is deposited to cover the gate electrode 5a and the upper capacitor electrode 5b. After that, a third conductive layer 9 which includes the pixel electrode 9a is formed on the SiO₂ film 6. The third conductive layer 9 also includes the connection pattern 9b. The third conductive layer 9 and the semiconductor layer 3 are connected through the contact hole 10a which is formed above the semiconductor layer 3. The contact hole 10b is formed above the line electrode 7a and the lower capacitor electrode 7b. The third conductive layer 9 and the line electrode 7a are connected through the contact hole 10b. The line electrode 7a is thereby connected with the source region 32 through the connection pattern 9b. Further, the third conductive layer 9 and the lower capacitor electrode 7b are connected through the contact hole 1ob. The lower capacitor electrode 7b is thereby connected with the drain region 33 through the pixel electrode 9a. The contact holes 10a and 10b are filled with a conductive film, which is a material of the third conductive layer 9. Thus, the third conductive layer 9 and the semiconductor layer 3 are both physically and electrically connected through the contact hole 10a. The third conductive layer 9 and the first conductive layer 7 are also both physically and electrically connected through the contact hole 10b. The line electrode 7a is connected with the source line 114 which is shown in FIG. 1.

The SiO₂ film 4 and the SiO₂ film 6 are placed between the semiconductor layer 3 and the third conductive layer 9. The contact hole 10a penetrates from the third conductive layer 9 through the SiO₂ film 6 and the SiO₂ film 4 to the semiconductor layer 3. The SiN film 2, the SiO₂ film 4 and the SiO₂ film 6 are placed between the first conductive layer 7 which include the line electrode 7a and the lower capacitor electrode 7b, and the third conductive layer 9. The contact hole 10b penetrates from the third conductive layer 9 through the SiO₂ film 6, the SiO₂ film 4 and the SiN film 6 to the first conductive layer 7.

In this embodiment, it is necessary that the second conductive layer 5 which includes the gate electrode 5a and the upper capacitor electrode 5b is not placed in the area where the contact hole 10a is formed. It is also necessary that the semiconductor layer 3 and the second conductive layer 5 are not placed in the area where the contact hole 10b is formed above the first conductive layer 7 which includes the line electrode 7a and the lower capacitor electrode 7b. Therefore, the portions of the semiconductor layer 3 and the first conductive layer 7 at which the contact holes are to be connected protrude from the area where the second conductive layer 5 is formed. The contact holes 10a and 10b are formed above the protruded portions.

As described above, the top-gate TFT substrate 110 of this embodiment is characterized by that the first conductive layer 7 which includes the line electrode 7a for connecting a plurality of elements such as a TFT and a capacitor is formed in a lower layer than the TFT 8. Specifically, the first conductive layer 7 which includes the line electrode 7a is formed in the area other than blow the TFT 8, and the inter-element connection area of the first conductive layer 7 is formed in the area other than below the second conductive layer 5 which includes the gate electrode 5a and the upper capacitor electrode 5b.

An example of a manufacturing method of the TFT substrate 110 according to this embodiment is described hereinafter with reference to FIG. 2. Firstly, the glass substrate 1, which is a light transmissive glass for example, is washed with pure water or acid. A substrate which is used as the TFT substrate 110 is not limited to the glass substrate 1, and it may be a plastic substrate such as a polycarbonate or acrylic substrate. Further, it may be a metal substrate such as SUS (Stainless Used Steel), which can be used as a substrate material provided an insulating protective layer is deposited thereon.

Next, the first conductive layer 7 which includes the line electrode 7a and the lower capacitor electrode 7b is formed on the glass substrate 1. Forming the first conductive layer 7 in a lower layer of the TFT substrate 110 is the main characteristics of this embodiment. The first conductive layer 7 which includes the line electrode 7a and the lower capacitor electrode 7b is formed in one process step, and it may be an Al (Aluminum) film with a thickness of 300 nm, for example. The first conductive layer 7, however, is not limited to Al, and it is preferred to use a material with low electrical resistance. It is further preferred that a material of the first conductive layer 7 has the lowest specific resistance of all conductive electrode films that are used in the TFT substrate 110.

The first conductive layer 7 maybe a single-layer film such as Ag (Silver), Cu (Copper), AlCu (Aluminum-Copper), AlSiCu (Aluminum-Silicon-Copper), Mo (Molybdenum), Ti (Titanium), W (Tangsten) or the like. A material that stacks a plurality of single-layer films, such as Mo/Al, may be also used.

In the formation of the first conductive layer 7 which includes the line electrode 7a and the lower capacitor electrode 7b, the above-described material is deposited by sputtering or the like. After that, the line electrode 7a and the lower capacitor electrode 7b are formed in island shapes by photoresist process. Specifically, the process bakes the photoresist which is coated on the first conductive layer 7, performs masking of the photoresist into a predetermine pattern, and further performs exposure thereon. The process then develops the photoresist using an organic alkaline developer, for example, and performs patterning. Further, the process performs wet etching on the first conductive layer 7 using a mixed solution of phosphoric acid and nitric acid, for example, thereby forming the line electrode 7a and the lower capacitor electrode 7b into desired patterns. The source line 114 may be formed at the same step. Then, the process removes the photoresist from the glass substrate 1 and washes the glass substrate 1 from which the photoresist is removed.

The sectional shape of the end of the first conductive layer 7 which includes the line electrode 7a and the lower capacitor electrode 7b is preferably a tapered shape. This enables good coverage of the laminated structure above the first conductive layer 7. Further, the taper angle of the end of the first conductive layer 7 which includes the line electrode 7a and the lower capacitor electrode 7b is preferably 10° to 60°.

It is important in this embodiment that the first conductive layer 7 is formed in a lower layer than the TFT 8, and the formation process or the film thickness are not particularly limited. Therefore, the above-described formation process of the line electrode 7a and the lower capacitor electrode 7b is by way of illustration only, and any other method that occur to those skilled in the art related to the manufacture of TFT are also applicable. This is not only for the formation of the line electrode 7a and the lower capacitor electrode 7b and the same for the formation of other elements of the TFT substrate 110, which are described below.

Then, the SiN layer 2 is deposited as an anti-diffusion layer on the glass substrate 1 where the first conductive layer 7 is formed. For example, SiN with a thickness of 200 nm may be deposited by CVD (Chemical Vapor Deposition) as the SiN layer 2. The SiN layer 2 insulates between the glass substrate 1 and the elements thereabove and also prevents diffusion of impurities from the glass substrate 1. The SiN layer 2 further suppresses the interface level density with the semiconductor layer 3 to be formed above the SiN layer 2 to stabilize the performance of the TFT 8. The anti-diffusion layer is not limited to SiN, and $SiN_2$ or the like may be used instead.

After that, the semiconductor layer 3 which includes the channel region 31, the source region 32 and the drain region 33 is formed in island shape. Firstly, on the glass substrate, a material of the semiconductor layer 3 is deposited with a thickness of 50 nm, for example. Although an amorphous silicon film or a micro crystal silicon film may be used as a material of the semiconductor layer 3, it is preferred to use a polysilicon film, which has higher quality, for better performance. However, it is difficult to form a polysilicon film directly on a typical inexpensive glass substrate by CVD because it requires heat treatment of 600° C. or higher. It is therefore preferred to form an amorphous silicon film on the glass substrate 1 by low-temperature CVD such as plasma CVD and then modify it into polysilicon by laser annealing. After that, the semiconductor layer 3 is formed in a desired shape by photoresist process and dry etching or the like.

On the semiconductor layer 3, the $SiO_2$ film 4, which serves as a gate insulating layer, is deposited with a thickness of 100 nm, for example. The $SiO_2$ film 4 has an effect of suppressing the interface level density with the semiconductor layer 3. To avoid thermal strain of glass that is a material of the glass substrate 1, it is preferred to deposit the $SiO_2$ film 4 by low temperature CVD. However, it is also possible to form the $SiO_2$ film 4 with a material different from a silicon dioxide film or by a TFT manufacturing process different from the low temperature CVD.

On the $SiO_2$ film 4, the second conductive layer 5 which includes the gate electrode 5a and the upper capacitor electrode 5b is formed in island shapes. The second conductive layer 5 which includes the gate electrode 5a and the upper capacitor electrode 5b is formed in one process step. The gate line 113 may be formed in the same step. As the second conductive layer 5, a Mo film with a thickness of 200 nm may be deposited by sputtering, for example. Then, the Mo film as the second conductive layer 5 is then patterned into a desired shape by photoresist process and etching. The etching of the Mo film is preferably wet etching using a mixed solution of phosphoric acid and nitric acid.

After forming the gate electrode 5a and the upper capacitor electrode 5b, an impurity such as Phosphorus (P) or Boron (B) is doped into the source region 32 and the drain region 33 of the semiconductor layer 3, using the gate electrode 5a as a mask. A highly concentrated impurity region is thereby formed in the semiconductor layer 3. The impurity may be injected by ion implantation, ion doping, or the like. The TFT 8 is produced by the above process.

After that, the $SiO_2$ film 6, which serves as an interlayer insulating layer, is deposited with a thickness of 500 nm, for example, on the second conductive layer 5 which includes the gate electrode 5a and the upper capacitor electrode 5b. The $SiO_2$ film 6 is an interlayer insulating layer that ensures insulation between the TFT 8 or a capacitor and the pixel electrode 9a. To avoid thermal strain of glass that is a material of the glass substrate 1, it is preferred to deposit the $SiO_2$ film 6 by low temperature CVD. However, it is also possible to form the $SiO_2$ film 6 with a material different from a $SiO_2$ film or by a TFT manufacturing process different from the low temperature CVD.

The process of forming the contact holes 10a and 10b is described hereinafter. This embodiment is characterized by that the contact holes 10a and 10b are formed in the same process step.

The contact hole 10a is formed to physically and electrically connect the third conductive layer 9 which includes the pixel electrode 9a with the source region 32 and the drain region 33 (the semiconductor layer 3). The contact hole 10a penetrates through the $SiO_2$ film 4 and the $SiO_2$ film 6 to thereby directly connect the third conductive layer 9 and the semiconductor layer 3. On the other hand, the contact hole 10b is formed to physically and electrically connect the third conductive layer 9 which includes the pixel electrode 9a with the first conductive layer 7 which includes the line electrode 7a and the lower capacitor electrode 7b. The contact hole 10a penetrates through the SiN film 2, the $SiO_2$ film 4 and the $SiO_2$ film 6 to thereby directly connect the third conductive layer 9 and the first conductive layer 7.

It is necessary that the second conductive layer 5 which includes the gate electrode 5a and the upper capacitor electrode 5b is not formed in the area where the contact hole 10a and the contact hole 10b are formed. Thus, the first conductive layer 7 which includes the line electrode 7a and the lower capacitor electrode 7b is placed in the area other than below the TFT 8, and the contact hole formation portion of the first conductive layer 7 is located in the area other than below the second conductive layer 5.

In the portion to form the contact holes 10a and 10b, resist is removed by photoresist process. Then, the SiO$_2$ film 6 and the SiO$_2$ film 4 are etched by dry etching. Further, the SiN film 2 is dry-etched, using the resist used in the photoresist process and the opening from which the SiO$_2$ film 6 and the SiO$_2$ film 4 are etched away. Because the semiconductor layer 3 is exposed at the bottom of the contact hole 10a, it is preferred to set the etching condition to have selectivity between the SiN film 2 and the semiconductor layer 3.

In the above process, it is possible to form the contact holes for connecting between the third conductive layer 9 and the semiconductor layer 3, and between the third conductive layer 9 and the first conductive layer 7 in one process step.

After forming the contact holes 10a and 10b, the third conductive layer 9 is formed. The third conductive layer 9 may be an ITO (Indium Thin Oxide) film with a thickness of 100 nm, for example. In this process, the ITO film, which is a conductive material, is also filled into the contact holes 10a and 10b. Thus, the ITO film as the conductive layer 9 is physically and electrically connected with the source region 32, the drain region 33 and the first conductive layer 7. Finally, the pixel electrode 9a is patterned into a desired shape by photoresist process, dry etching, or wet etching. The pixel electrode 9a is not limited to the ITO film, and it may be other transparent conductive films such as an IZO film and an ITZO film. When this embodiment is applied to a reflective display device using outside light, the pixel electrode 9a may be made of a material having high light reflectivity such as aluminum or silver. When this embodiment is applied to an organic EL display device, a self-luminous material or a counter electrode may be placed on the pixel electrode 9a.

As described in the foregoing, the first conductive layer 7 which includes the line electrode 7a for establishing connection between a plurality of elements such as a TFT and a capacitor is formed in a lower layer than the TFT 8 in this embodiment. Therefore, the pixel electrode 19 is not connected with the semiconductor layer 13 or with the lower capacitor electrode 13a through the line electrode 17 as shown in the related art of FIG. 3. The pixel electrode 9a can be thus directly connected with the semiconductor layer 3 and with the lower capacitor electrode 7b. Accordingly, the contact hole 10a for connecting the third conductive layer 9 with the semiconductor layer 3 (the source region 32 and the drain region 33) and the contact hole 10b for connecting the third conductive layer 9 with the first conductive layer 7 may be formed in the same process step. The formation of the contact holes 10a and 10b thus requires one photoresist process and one dry etching process only. The number of process steps required for the contact hole formation therefore decreases from two to one, which reduces the number of masks and manufacturing steps, thereby lowering manufacturing costs.

Figure 3:
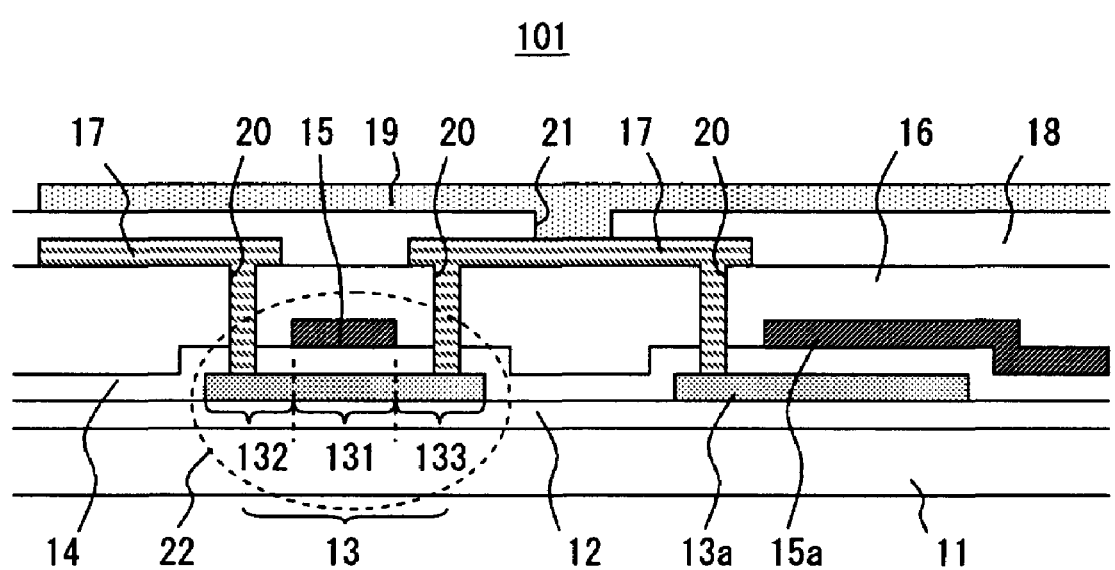
FIG. 3 is a sectional view showing a TFT substrate according to a related art.

Further, this embodiment eliminates the need for the upper insulating layer 18, which is necessary in the related art to insulate between the line electrode 17 and the pixel electrode 19 as shown in FIG. 3. This reduces the manufacturing cost for forming the upper insulating layer 18.

Furthermore, because the first conductive layer 7 which includes the line electrode 7a and the lower capacitor electrode 7b is made of a material with low specific resistance, the film thickness can be as thin as possible. It is thereby possible to avoid process risks such as poor coverage due to a step in a primary coat and etching residue. Because the ends of the first conductive layer 7 are taperd at 10° to 60°, it provides good coverage of the laminated films of the SiN film 2 and upper.

The present invention is not limited to the above-described embodiments but is susceptible of numerous changes and modifications as known to those skilled in the art without departing from the scope of the invention.

From the invention thus described, it will be obvious that the embodiments of the invention may be varied in many ways. Such variation are not to be regarded as a departure from the spirit and scope of the invention, and all such modifications as would be obvious to one skilled in the art are intended for inclusion within the scope of the following claims.

What is claimed is:

1. A thin film transistor substrate comprising:
   a substrate;
   a first conductive layer formed above the substrate, the first conductive layer including a line electrode;
   an anti-diffusion layer deposited to cover the first conductive layer;
   a semiconductor layer formed in island shape above the anti-diffusion layer, the semiconductor layer including a channel region, a source region and a drain region;
   a gate insulating layer deposited to cover the semiconductor layer;
   a second conductive layer including a gate electrode formed above the channel region with the gate insulating layer interposed therebetween;
   an interlayer insulating layer deposited to cover the second conductive layer; and
   a third conductive layer formed above the interlayer insulating layer, in a first contact hole penetrating through the interlayer insulating layer and the gate insulating layer to reach the semiconductor layer, and in a second contact hole penetrating through the interlayer insulating layer, the gate insulating layer, and the anti-diffusion layer to reach the first conductive layer, the third conductive layer including a pixel electrode formed in island shape above the interlayer insulating layer.

2. The thin film transistor substrate according to claim 1, wherein the first contact hole and the second contact hole are formed in one etching process.

3. The thin film transistor substrate according to claim 1, wherein the first conductive layer is a material having a lower specific resistance than materials of the semiconductor layer, the second conductive layer and the third conductive layer.

4. The thin film transistor substrate according to claim 1, wherein the first conductive layer is a single-layer film composed of one selected from Ag, Cu, AlCu, AlSiCu, Mo, Ti and W, or a laminated film composed of a plurality of single-layer films.

5. The thin film transistor substrate according to claim 1, wherein an end of the first conductive layer is taper-shaped.

6. The thin film transistor substrate according to claim 5, wherein a taper angle of the end of the first conductive layer is 10 to 60 degrees.

7. The thin film transistor substrate according to claim 1, wherein a gate line connected with the gate electrode and a source line connected with the line electrode are formed to cross each other.

8. A display device comprising the thin film transistor substrate according to claim 1.

9. A manufacturing method of a thin film transistor comprising:

forming a first conductive layer including a line electrode above a substrate;

depositing an anti-diffusion layer to cover the first conductive layer;

forming an island-shaped semiconductor layer including a channel region, a source region and a drain region, above the anti-diffusion layer;

depositing a gate insulating layer to cover the semiconductor layer;

forming an island-shaped second conductive layer including a gate electrode formed above the channel region with the gate insulating layer interposed therebetween;

depositing an interlayer insulating layer to cover the second conductive layer;

forming a first contact hole penetrating through the interlayer insulating layer and the gate insulating layer to reach the semiconductor layer, and a second contact hole penetrating through the interlayer insulating layer, the gate insulating layer and the anti-diffusion layer to reach the first conductive layer; and forming a third conductive layer including a pixel electrode above the interlayer insulating layer after forming the first contact hole and the second contact hole.

* * * * *